(12) United States Patent
Feigl

(10) Patent No.: US 9,124,040 B2
(45) Date of Patent: Sep. 1, 2015

(54) PCB CONNECTOR HAVING A CONDUCTIVE BASE BODY HAVING A SPRING BODY AND A PUT-THROUGH BODY

(71) Applicant: Knuerr GmbH, Arnstorf (DE)

(72) Inventor: Josef Feigl, Arnstorf (DE)

(73) Assignee: Knuerr GmbH, Arnstorf (DE)

( * ) Notice: Subject to any disclaimer, the term of this patent is extended or adjusted under 35 U.S.C. 154(b) by 0 days.

(21) Appl. No.: 14/248,888

(22) Filed: Apr. 9, 2014

(65) Prior Publication Data

US 2014/0315398 A1 Oct. 23, 2014

(30) Foreign Application Priority Data

Apr. 22, 2013 (DE) .......... 10 2013 006 923

(51) Int. Cl.
| | |
|---|---|
| H01R 12/00 | (2006.01) |
| H01R 12/70 | (2011.01) |
| H01R 12/58 | (2011.01) |
| H05K 3/40 | (2006.01) |
| H01R 12/52 | (2011.01) |

(52) U.S. Cl.
CPC .......... *H01R 12/7082* (2013.01); *H01R 12/585* (2013.01); *H05K 3/40* (2013.01); *H01R 12/523* (2013.01)

(58) Field of Classification Search
CPC ........ H01R 12/70; H01R 12/71; H01R 12/72; H01R 12/73
USPC ....................................................... 439/65–66
See application file for complete search history.

(56) References Cited

U.S. PATENT DOCUMENTS

| | | | | |
|---|---|---|---|---|
| 3,173,732 | A | * | 3/1965 | James .............................. 439/74 |
| 6,270,356 | B1 | * | 8/2001 | Hoshino et al. .................. 439/70 |
| 2008/0057748 | A1 | * | 3/2008 | Nakata et al. ................... 439/69 |
| 2012/0156898 | A1 | * | 6/2012 | Kallee ............................. 439/65 |

FOREIGN PATENT DOCUMENTS

| | | |
|---|---|---|
| DE | 20312802 U1 | 12/2003 |
| DE | 102009021730 A1 | 11/2010 |

* cited by examiner

*Primary Examiner* — Chandrika Prasad
(74) *Attorney, Agent, or Firm* — Harness, Dickey & Pierce, P.L.C.

(57) ABSTRACT

The invention relates to a PCB connector for fastening a first printed circuit board on a second printed circuit board. The PCB connector may have a longitudinal base body with a clamping and fastening device for tool-free fastening of the PCB connector on a printed circuit board. The clamping and fastening device has a put-through body and a spring body which is formed extendable upon putting-through the put-through body through the land. The base body is thus pressed against the printed circuit board by the spring body.

9 Claims, 2 Drawing Sheets

PCB CONNECTOR HAVING A CONDUCTIVE BASE BODY HAVING A SPRING BODY AND A PUT-THROUGH BODY

FIELD

The invention relates to a PCB connector (printed circuit board connector) for fastening a first printed circuit board on a second printed circuit board and for providing an electrically conductive connection between the two printed circuit boards.

BACKGROUND

Different methods are known for providing an electrically conductive connection between two printed circuit boards. The most common way is to connect the two printed circuit boards electrically and/or in a signal-transmitting way with a cable connection. To this end corresponding plugs or sockets are provided at the cable or at the corresponding printed circuit boards, into which then the counter piece at the cable is inserted in each case.

For providing also a physically strong connection, it is known to mount spacer bolts between the two printed circuit boards. These as well can be configured to be electrically conductive. Mounting the spacer bolts is usually carried out by soldering these to the printed circuit boards. To this end, a corresponding thread can be provided or cut in the printed circuit board, for example.

However, it is a disadvantage of all these connection methods that soldering and/or screwing work has to be done. The soldered connection can often only be achieved by manual soldering. This reduces the degree of automation and also limits the process security.

SUMMARY

An object underlying the invention is thus to provide a PCB connector which enables easy and efficient, in particular tool-free, connection of two printed circuit boards.

This object is solved according to the invention with a new PCB connector.

The PCB connector of the invention may comprise a longitudinal electrically conductive base body which comprises at least at a first end a clamping and fastening device for a tool-free fastening of the PCB connector on a printed circuit board in a land. At the first end of the base body a put-through body is formed for putting through the land of the printed circuit board. The base body and the put-through body form a stop which defines a put-through depth of the put-through body through the land. Furthermore a spring body is provided which is formed to be expandable upon and/or after puffing the put-through body through the land, whereby the base body is pressed by the spring body against the printed circuit board. Here, the put-through body and the spring body at least partially form the clamping and fastening device.

A land may also be referred to as a land for soldering. In particular, it may be formed with a hole or a through hole in the respective printed circuit board. Such a hole may be denoted as a land, independent of whether or not a soldered connection is actually established at this hole.

A basic idea of the invention can be seen in that a tool-free attachment of a PCB connector or a board connector at least at one printed circuit board is made possible. To this end, a clamping and fastening device is provided at one end of the PCB connector. This is construed such that the clamping and fastening device fixates the PCB connector at the printed circuit board by means of a simple insertion of the PCB connector. On the one hand, a sufficiently stable physical connection between the printed circuit board and the base body of the PCB connector is thus provided. On the other hand also an electrically conductive connection between the printed circuit board and the base body is established.

According to the invention the clamping and fastening device is at least partially formed by the put-through body and the spring body. The design of the spring body and the put-through body is here such that the spring body is extended upon putting-through or after puffing-through of the put-through body through the land of the printed circuit board. The extending causes a clamping of the put-through body and thus of the base body at the land. In more detail, the put-through body is moved from an upper side of the printed circuit board through the printed circuit board towards the lower side. The spring body is built such that it expands at the lower side of the printed circuit board upon exiting or upon putting-through the put-through body, which prevents or at least hampers moving back the put-through body and thus also the base body.

The stop which is formed by the base body and the put-through body causes the put-through body to be secured against a further insertion and passing through the land.

With this construction the PCB connector can be fixed in the land in both the put-through direction and transverse to the put-through direction.

In a preferred embodiment the spring body is formed sleeve-like. Furthermore, the spring body may have an outer diameter that substantially corresponds to an inner diameter of the land. In this embodiment provision may be made that firstly the base body is inserted in the land. Subsequently the put-through body is put through the land, whereby the put-through body extends the spring body upon exiting at the lower side of the printed circuit board, as described above, and thus clamps itself at the lower side of the printed circuit board. However, the spring body can also be inserted in the land simultaneously with the put-through body.

It is preferred that a shoulder is formed at a first end portion at the spring body. The shoulder can define a penetrating depth of the spring body in the land. This has the advantage that in this way it can be defined where the lower end portion of the base body ends relative to the land and its end at the lower end of the printed circuit board, or how far the spring body extends over the land, which can also be referred to as a soldering hole, at the lower portion of the printed circuit board.

The spring body may be formed to be bent towards the central axis of the spring body at its second end portion. This construction causes a correspondingly defined put-through body to extend the spring body upon insertion of the base body in the spring body or upon reaching the second end portion, and thus to clamp the put-through body on the land.

Furthermore the put-through body may comprise a snap-in device for the second end portion of the spring body at its end portion facing away from the base body. The snap-in device may, for example, be formed as a tapering groove. By snapping-in of the second end portion of the spring body in the snap-in device, the put-through body, and thus the base body, are additionally secured against pulling back in the direction of the upper side of the printed circuit board.

It is preferred that the put-through body has a widening at its end portion facing away from the base body. This widening facilitates a stretching of the spring body. Furthermore, a part of the put-through body can then be sized to be smaller than the diameter of the land, which facilitates the putting-through itself. This, however, is not necessarily required.

In a preferred embodiment the spring body is formed integrated in the put-through body. Here, the spring body may be formed to be compressible. It is in this case preferred that the spring body has a diameter in an unloaded state that is larger than the diameter of the land. In this way it is achieved that the spring body is compressed upon putting-through of the put-through body which is formed integral with the spring body. As soon as the put-through body is at least partially inserted through the land, the spring body extends again. Through this expanding, the put-through body, and thus also the base body, are again secured against a pulling back of the base body in the direction of the upper side of the printed circuit board.

In general it is possible to provide a clamping and fastening device at only one end at the base body. However, it is also possible to provide corresponding clamping and fastening devices at both ends of the base body. The PCB connector can thus be fixed tool-free at both printed circuit boards that it can interconnect. However, it is also possible if so desired—e.g., for reasons of production—to provide for only one clamping and fastening device at only one end of the base body. The other end can then be fixed at the printed circuit board with a conventional fixation method, e.g., by soldering or screwing.

BRIEF DESCRIPTION OF DRAWINGS

In the following, the invention will be further described with reference to exemplary embodiments and schematic drawings. In the drawings.

DETAILED DESCRIPTION

Figure 1:
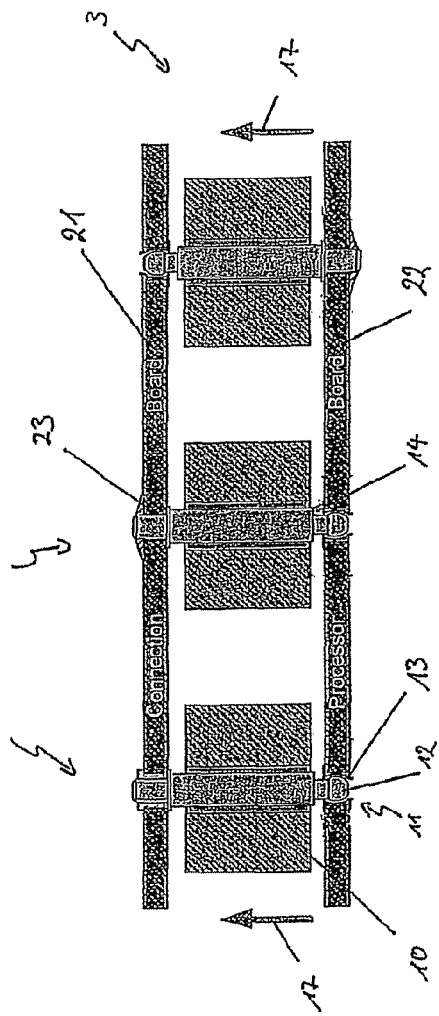
FIG. 1 shows two printed circuit boards with three PCB connectors according to the invention before assembly of the two printed circuit boards.

FIG. 1 shows two printed circuit boards 21, 22 which are interconnected with three PCB connectors 1, 2, 3 according to the invention. The printed circuit boards 21, 22 are here aligned substantially parallel to each other. The inventive PCB connectors 1, 2 3 allow both a physical as well as an electrical connection between the two printed circuit boards. The first printed circuit board 21 may be, for example, a connection board and the second printed circuit board 22 may be a processor board.

As described in the following, these two printed circuit boards 21, 22 are connected to each other with three PCB connectors 1, 2, 3 according to the invention. Each of the three PCB connectors 1, 2, 3 shown represents another embodiment of an inventive PCB connector 1, 2, 3. In the following, reference will be made to substantially the PCB connector 1 and the main components of the inventive PCB connectors 1, 2, 3 will be described. With reference to the other PCB connectors 2, 3, only the respective differences will be addressed.

The inventive PCB connector 1 comprises a base body 10 and a clamping and fastening device 11 at its end that neighbors the printed circuit board 22. The clamping and fastening device 11 maybe formed with a put-through body 12 and a spring body 13. The exact construction of the clamping and fastening device 11 will be explained in greater detail later with reference to the FIGS. 3 and 4.

For the end of the PCB connector 1 that faces the printed circuit board 21, a conventional connection is provided. The PCB connector 1 may, for example, be fixed with a branching nut and the PCB connector 2 may be fixed with a conventional soldered connection to the printed circuit board 21.

The put-through body 12 of the PCB connector 1 is already partially put into a solder land 23 of the printed circuit board 22. Similarly, the spring body 13 is already inserted in the same land 23.

The same embodiment of the clamping and fastening device 11 is also shown with reference to the two PCB connectors 2 and 3. Here, the PCB connector 3 is formed inverted to the version of the PCB connector 2. This means that it is connected at the printed circuit board 22 with a soldered connection and it comprises its clamping and fastening device 11 at the end facing the printed circuit board 21. Through a force acting in the direction of printed circuit board 21, the connection between the two printed circuit boards 21, 22 is established. The direction of the acting force is indicated in FIG. 1 with the two arrows 17.

Figure 2:
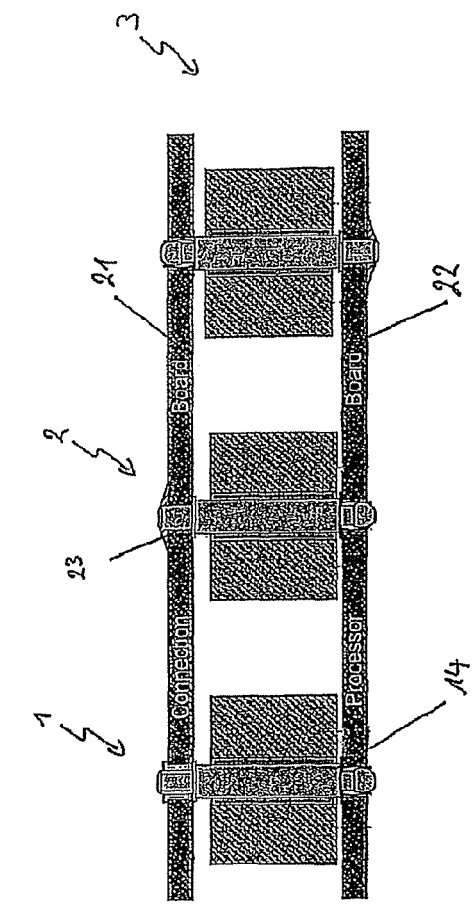
FIG. 2 shows two printed circuit boards with three PCB connectors according to the invention after assembly of the two printed circuit boards.

FIG. 2 shows the two printed circuit boards 21, 22 with the three PCB connectors 1, 2, 3 of FIG. 1 in the connected state. Here, the put-through bodies 12 are inserted deeper in the respective lands 23 of the second printed circuit board 22 or the first printed circuit board 21 by means of the afore-described pressure. By interaction with the spring bodies 13, the put-through bodies 12 have been clamped in the lands 23 such that a pulling-back against the direction of the arrows 17 shown in FIG. 1 is basically prohibited.

The penetration depth of the put-through bodies 12 is defined by a stop 14. This stop 14 is achieved by the shaping of the put-through body 12 and the base body 10. Here, the put-through body 12 has at the fixing portion at the base body 10 a smaller diameter than the base body 10. In this way the stop 14 is formed.

Figure 3:
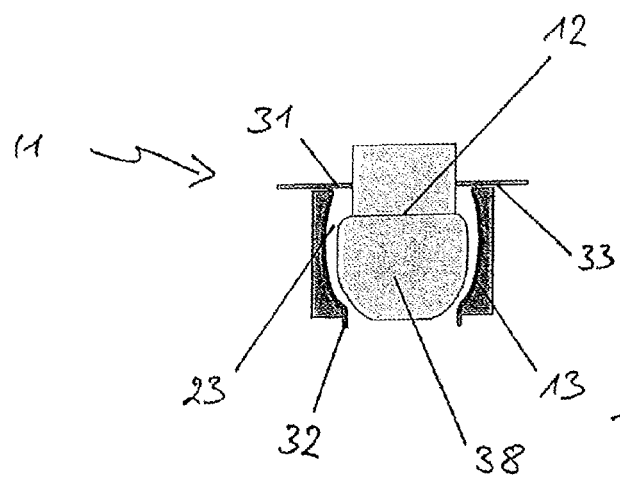
FIG. 3 shows an enlarged view of a clamping and fastening device of a PCB connector according to the invention before the assembly thereof.

In the following, an enlarged view of the clamping and fastening device 11 is described with reference to the FIGS. 3 and 4. FIG. 3 shows the state that is not assembled, and FIG. 4 shows the state that is assembled.

Figure 4:
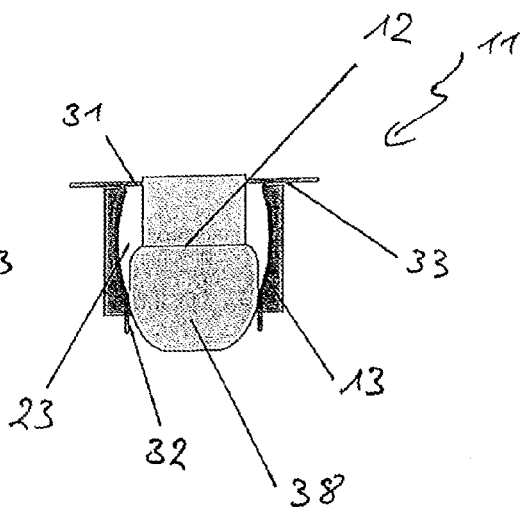
FIG. 4 shows an enlarged view of a clamping and fastening device of a PCB connector according to the invention after the assembly thereof.

A part of a printed circuit board 21, 22 with a land 23 is respectively shown in FIGS. 3 and 4. The spring body 13 is inserted in the land 23. In the embodiment shown here, the land 23 comprises a spherical shape. However, this is not necessarily required. It can also be formed as a simple hole with a constant diameter.

A shoulder 33 is formed in a first end portion 31 of the spring body 13. This shoulder 33 serves as a stop at the printed circuit board 21, 22 upon inserting the spring body 13 in the land 23. With the shoulder 33 and the stop formed with it, the penetration depth of the spring body 13 in the land 23 can be defined. In the embodiment shown, the spring body 13 narrows towards its second end portion 32.

If the put-through body 12 is inserted deeper in the land 23, as shown in particular in FIG. 4, it contacts the spring body 13 and expands it outwardly. Depending on the exact variant of the spring body 13 and the land 23, the spring body 13 can be expanded further or only little. Through this expansion of the spring body, the put-through body 12 is held in the land 23 as the diameter of the spring body 13 and thus the diameter of the clamping and fastening device 11 outside the land 23 below the printed circuit boards 21, 22 is enlarged. In this way a pulling-back of the put-through body 12 and the base body 10 connected therewith is hampered.

For improving the clamping in the land 23, the put-through body 12 has a widening at its end portion 38. This is, however, not necessarily required, depending on the exact design of the put-through body 12.

For reasons of clarity, the base body 10 is not shown in the FIGS. 3 and 4.

Figure 5:
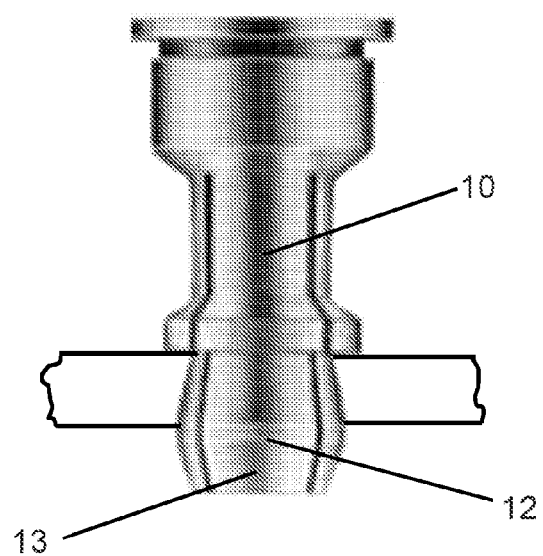
FIG. 5 shows an enlarged view of a clamping and fastening device of another embodiment of a PCB connector according to the invention after the assembly thereof.

FIG. 5 shows a further possible embodiment of the clamping and fastening device of a PCB connector according to the invention.

Here, the put-through body 12 and the spring body 13 are formed integrally. This integrally formed put-through and spring body 12, 13 has a regular diameter that is larger than the diameter of the land 23. It is, however, designed such that it is compressible by acting external forces.

In this way it is possible to put the put-through body 12 through the land 23. In other words, it is compressed upon putting it through the land 23. As soon as at least a part of the put-through body 12 has reached the other side of the land 23, it again expands.

The clamping and fastening device 11 is thus formed and the PCB connector 1 is pressed against the printed circuit boards 21, 22. To assist in this, the put-through body 12 with the integrated spring body 13 may have a slightly pointed end shape which facilitates insertion in the land 23.

With the PCB connector of the invention it is thus possible to connect two printed circuit boards easily and efficiently, in particular tool-free, both physically and electrically.

The invention claimed is:

1. PCB connector for fastening a first printed circuit board on a second printed circuit board and for providing an electrically conductive connection between the two printed circuit boards, the PCB connector comprising:
   a longitudinal electrically conductive base body having at least at a first end a clamping and fastening device for tool-free fastening of the PCB connector at one of the printed circuit boards in a land, and
   a spring body is provided wherein:
      at the first end of the base body a put-through body for putting through the land of the printed circuit board is formed, wherein the base body and the put-through body are formed integrally,
      the base body and the put-through body form a stop for defining a put-through depth of the put-through body through the land,
      the spring body is configured to be expandable upon and/or after putting the put-through body through the land, wherein the base body is pressed by the spring body against the printed circuit board,
      the put-through body and the spring body at least partially form the clamping and fastening device, and
      a shoulder is formed at a first end portion at the spring body for defining a penetration depth of the spring body in the land.

2. PCB connector according to claim 1, wherein the spring body is formed sleeve-like.

3. PCB connector according to claim 1, wherein the spring body has an outer diameter that substantially corresponds to the inner diameter of the land.

4. PCB connector according to claim 1, wherein a second end portion of the spring body is formed to be bent towards a central axis of the spring body.

5. PCB connector according to claim 1, wherein the put-through body comprises a snap-in device for a second end portion of the spring body at its end portion facing away from the base body.

6. PCB connector according to claim 1, wherein the put-through body has a widening at its end portion facing away from the base body.

7. PCB connector according to claim 1, wherein the spring body is formed integrated in the put-through body.

8. PCB connector according to claim 1, wherein the spring body is formed compressible and the spring body has a diameter in an unloaded state that is larger than a diameter of the land.

9. PCB connector according to claim 1, wherein a clamping and fastening device is formed at each of a first end and a second end of the base.

* * * * *